(12) United States Patent
Moesle et al.

(10) Patent No.: US 9,681,124 B2
(45) Date of Patent: Jun. 13, 2017

(54) METHOD AND DEVICE FOR TESTING AN IMAGE SENSOR AND MOTOR VEHICLE

(71) Applicant: Robert Bosch GmbH, Stuttgart (DE)

(72) Inventors: Frank Moesle, Stuttgart (DE); Hans-Georg Drotleff, Rutesheim (DE); Marc Geese, Gerlingen (DE); Ulrich Seger, Leonberg-Warmbronn (DE); Uwe Beutnagel-Buchner, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1 day.

(21) Appl. No.: 14/818,929

(22) Filed: Aug. 5, 2015

(65) Prior Publication Data
US 2016/0044307 A1    Feb. 11, 2016

(30) Foreign Application Priority Data
Aug. 11, 2014  (DE) .................. 10 2014 215 860

(51) Int. Cl.
| | |
|---|---|
| H04N 17/00 | (2006.01) |
| G01R 31/26 | (2014.01) |
| H04N 9/07 | (2006.01) |
| G03B 43/00 | (2006.01) |

(52) U.S. Cl.
CPC ....... *H04N 17/002* (2013.01); *G01R 31/2639* (2013.01); *G01R 31/2641* (2013.01); *H04N 9/07* (2013.01); *G03B 43/00* (2013.01)

(58) Field of Classification Search
USPC ........................................... 348/187
See application file for complete search history.

(56) References Cited

U.S. PATENT DOCUMENTS

| | | | |
|---|---|---|---|
| 8,736,684 B1 * | 5/2014 | Johansson ............ | H04N 17/002 348/180 |
| 2008/0158363 A1 * | 7/2008 | Myers .................. | H04N 17/002 348/187 |
| 2012/0310575 A1 * | 12/2012 | Cheng .................... | G09G 3/006 702/82 |
| 2013/0027565 A1 * | 1/2013 | Solhusvik .............. | H04N 5/335 348/187 |
| 2013/0083204 A1 * | 4/2013 | Solhusvik .............. | H04N 5/378 348/187 |
| 2013/0293724 A1 * | 11/2013 | Martinussen ........ | H04N 17/002 348/175 |
| 2014/0094993 A1 * | 4/2014 | Johnson ............... | H04N 17/002 701/1 |

(Continued)

*Primary Examiner* — Shahbaz Nazrul
(74) *Attorney, Agent, or Firm* — Norton Rose Fulbright US LLP; Gerard Messina

(57) ABSTRACT

In a method for testing an image sensor having (i) regular pixels and test pixels, of which each is interconnected with one of two predefined voltage values, and (ii) a signal processing unit for providing digital signal values for output voltages of the pixels and test pixels, the following steps are performed: receiving digital signal values of the test pixels; and using the signal values of at least one proper or improper subset of the test pixels for testing the image sensor, all test pixels of the subset being interconnected with a first of the two voltage values. Using the test pixels for testing allows testing during ongoing operation, i.e., during reception of regular image signals.

9 Claims, 1 Drawing Sheet

| Tn,0 | Tn,1 | Tn,2 | Tn,3 |
|---|---|---|---|
| Tn+1,0 | Tn+1,1 | Tn+1,2 | Tn+1,3 |
| Tn+2,0 | Tn+2,1 | Tn+2,2 | Tn+2,3 |
| Tn+3,0 | Tn+3,1 | Tn+3,2 | Tn+3,3 |

...

| Tn,j-2 | Tn,j-1 |
|---|---|
| Tn+1,j-2 | Tn+1,j-1 |
| Tn+2,j-2 | Tn+2,j-1 |
| Tn+3,j-2 | Tn+3,j-1 |

(56) References Cited

U.S. PATENT DOCUMENTS

2014/0244194 A1* 8/2014 Shin .................. G01R 31/3624
702/64
2015/0281684 A1* 10/2015 Beck .................... G06T 7/0018
348/175

* cited by examiner

Fig. 1

| Tn,0   | Tn,1   | Tn,2   | Tn,3   |
|--------|--------|--------|--------|
| Tn+1,0 | Tn+1,1 | Tn+1,2 | Tn+1,3 |
| Tn+2,0 | Tn+2,1 | Tn+2,2 | Tn+2,3 |
| Tn+3,0 | Tn+3,1 | Tn+3,2 | Tn+3,3 |

...

| Tn,j-2   | Tn,j-1   |
|----------|----------|
| Tn+1,j-2 | Tn+1,j-1 |
| Tn+2,j-2 | Tn+2,j-1 |
| Tn+3,j-2 | Tn+3,j-1 |

METHOD AND DEVICE FOR TESTING AN IMAGE SENSOR AND MOTOR VEHICLE

BACKGROUND OF THE INVENTION

1. Field of the Invention

The present invention relates to a method and a device for testing an image sensor and to a motor vehicle.

2. Description of the Related Art

When image sensors are used in safety-critical applications, such as driver assistance systems or evasive steering support systems in motor vehicles, it is necessary to test the image sensor to ensure its correct functional capability.

Within the meaning of the present invention, image sensors include pixels and a signal processing unit for providing digital signal values of the pixels. A portion of the pixels, the so-called test pixels, is connected in each case to one of two predefined voltage values. The remaining, regular pixels put out voltages as a function of the intensity of the light incident upon the particular pixel. The pixels are usually arranged in a matrix made up of rows and columns.

One option for testing an image sensor involves evaluating associated signal values of the regular pixels with respect to a test pattern. The image sensor may include an internal memory, for example, to which the test pattern may be temporarily written or permanently written. Moreover, the image sensor may be designed so that one or more reference voltages may be applied to the pixels.

While the image sensor is being tested, no regular image output may take place, i.e., no regular image signals may be provided from digital signal values which are determined by the instantaneous incident light. Tests of the image sensor are therefore carried out during start-up, during maintenance or in the idle state of the image sensor.

For end-of-line calibration or other purposes, test pixels are sometimes provided in image sensors, which are fixedly interconnected with one of two predefined voltage values, instead of varying their output voltage as a function of the incident light.

BRIEF SUMMARY OF THE INVENTION

The present invention introduced here allows an image sensor to be tested, the regular image output of the image sensor remaining possible.

According to the present invention, a method for testing an image sensor is introduced, the image sensor including regular pixels and test pixels, of which each is interconnected with one of two predefined voltage values, and a signal processing unit for providing digital signal values for output voltages of the pixels and test pixels. The method includes receiving digital signal values of the test pixels and is characterized by using the signal values of at least one proper or improper subset of the test pixels for testing the image sensor, all test pixels of the subset being interconnected with a first of the two voltage values.

Using the test pixels for testing allows testing during ongoing operation, i.e., during reception of regular image signals.

In one advantageous specific embodiment, the test pixels are arranged in rows and columns and interconnected in blocks, test pixels within one block being identically interconnected and test pixels within adjoining blocks being differently interconnected. To test the image sensor, signal values of subsets may then be used, which in each case include all test pixels from one row, one column, one block or from all blocks which are interconnected with the first voltage value.

In this way, relative deviations of individual test pixels or multiple test pixels in individual rows, columns or blocks may be easily determined.

The image sensor may be tested for a brightness error, for a row processing error, for a column processing error, a block position deviation and/or an image shift. These are the most frequent errors of image sensors.

To test the image sensor, it is also possible to use signal values of subsets which in each case include all test pixels from one row, one column, one block or from all blocks which are interconnected with the second of the two voltage value. In this way, an absolute brightness offset of all test pixels may be established.

To test the image sensor, it is possible to test signal values of one of the used subsets, the signal values of the remaining used subsets being used. In this way, a row or column error may be detected. Moreover, errors in blocks may be identified in this way.

Using averaging across the signal values of the test pixels of the subset, a lower and a greater limiting value may be determined. The limiting values account for noise to which the voltages output by the pixels are subjected.

The limiting values may furthermore be determined using a temperature measurement. In this way, it is possible to take a temperature dependence of the noise into consideration.

A signal value of a test pixel from the subset may be compared to the limiting values. The test pixel may then be identified as faulty when the signal value is lower than the lower limiting value or greater than the greater limiting value.

In this way, it is possible to identify faulty pixels. For example, a test pixel may be compared to all identically interconnected test pixels in the same column, in the same row, in the same block or from all test pixels.

According to the present invention, moreover a device for testing an image sensor is introduced, the image sensor including regular pixels and test pixels, of which each is interconnected with one of two predefined voltage values, and a signal processing unit for providing digital signal values for output voltages of the pixels and test pixels. The device includes means for receiving signal values of the test pixels and is characterized by an electronic data processing device which is designed to carry out the method according to the present invention or one of its specific embodiments for testing the image sensor.

The device allows testing of an image sensor during ongoing operation, i.e., during reception of regular image signals.

Moreover, a motor vehicle including an image sensor and a device according to the present invention is introduced. The image sensor includes regular pixels and test pixels, of which each is interconnected with one of two predefined voltage values, and a signal processing unit for providing digital signal values for output voltages of the pixels and test pixels. The device is connected to the image sensor in such a way that it is able to receive the signal values of the test pixels of the subset.

BRIEF DESCRIPTION OF THE DRAWINGS

FIG. 1 shows, by way of example, a set of test pixels which are arranged in rows and columns and interconnected in blocks;

FIG. 2 shows, by way of example, a pattern of an expected digital signal response of the image sensor in an exemplary interconnection of the test pixels.

DETAILED DESCRIPTION OF THE INVENTION

An image sensor which is suited for an exemplary specific embodiment of the present invention includes a matrix of regular pixels which are supplied with a reference voltage different from ground. Each regular pixel provides an output voltage, whose level depends on the intensity of the light incident upon the particular regular pixel. For example, the output voltage is equal to the reference voltage for incident light above an upper intensity threshold and equal to ground for incident light below a lower intensity threshold. The output voltage is proportional to the intensity of the incident light between the intensity thresholds. Test pixels are situated at the edge of the matrix.

The output voltages of the regular pixels and of the test pixels are converted into digital signal values by a signal processing unit included in the image sensor, the signal values being provided to one or more outputs of the signal processing unit. The digital signal values may assume the value 0, the value 100 or values corresponding to natural numbers between 0 and 100, for example. When the image sensor functions correctly, for example, the digital signal value 0 corresponds to no incident light (black), and the digital signal value 100 corresponds to the maximum incident light (white). The signal processing unit may in particular include means for analog-to-digital conversion. The signal processing unit may furthermore include means for analog amplification and/or means for digital amplification.

Figures 1, 2:
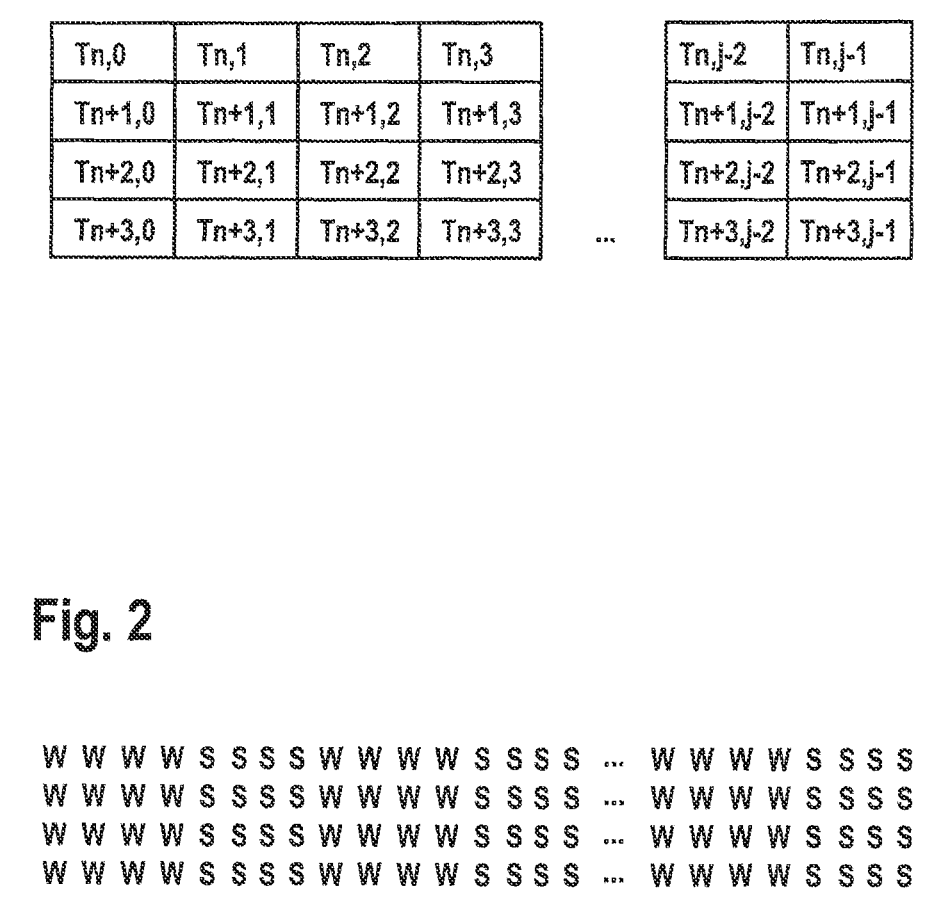

FIG. 1 shows an exemplary arrangement of test pixels $T_{n,0} \ldots T_{n+3,j-1}$. The arrangement is situated with j regular pixels of an image sensor in each case below n rows. The n*j regular pixels generate voltages as a function of the incident light upon the particular regular pixel. Test pixels $T_{n,k} \ldots T_{n+3,k}$ are situated below a column k of regular pixels. Test pixels may additionally or alternatively be situated above, to the left and/or right of the regular pixels. The number of columns of the test pixels above or below the regular pixels may, but need not, agree with the number of columns of the regular pixels. In particular, the number of columns of the test pixels above or below the regular pixels may be lower or greater than the number of columns of the regular pixels. The number of rows of the test pixels to the right or left of the regular pixels may, but need not, agree with the number of rows of the regular pixels. In particular, the number of rows of the test pixels to the right or left of the regular pixels may be lower or greater than the number of rows of the regular pixels.

Test pixels $T_{n,0} \ldots T_{n+3,j-1}$ are interconnected with ground or the reference voltage, so that the output voltage of a functional test pixel corresponds to the connected voltage. Test pixels in the exemplary embodiment in one and the same column are interconnected with the same voltage, either ground or the reference voltage. In the example, test pixels in adjoining columns k and k+1 may be differently interconnected precisely when (k+1) modulo 4=0, i.e., when the division of k+1 by 4 results in an integer. In general, the different interconnection of adjoining columns of the test pixels may exist for I rows of test pixels $T_{n,0} \ldots T_{n+I,j}$ precisely when (k+1) modulo I=0, i.e., when the division of k+1 by I results in an integer. The test pixels are thus identically interconnected in blocks of I*I test pixels each and alternate each other. Blocks having a number of columns which deviates from a number of rows of the blocks are also possible. For I>4 rows of test pixels $T_{n,0} \ldots T_{n+I,j}$, it is also possible for the interconnection to change in the columns every four rows, and for the different interconnection of adjoining test pixels in one and the same row in columns k and k+1 to exist precisely when (k+1) modulo 4=0, i.e., when the division of k+1 by 4 results in an integer.

For example, test pixels $T_{n,0} \ldots T_{n+3,3}$ are interconnected with the higher reference voltage, and test pixels $T_{n,4} \ldots T_{n+3,7}$ are interconnected with ground. Test pixels $T_{n,8} \ldots T_{n+3,11}$ are again interconnected with the higher reference voltage, and test pixels $T_{n,12} \ldots T_{n+3,15}$ are again interconnected with ground, and so forth.

Many other interconnection patterns are possible. Each interconnection pattern has an assigned, expected pattern of digital signals of the test pixels.

FIG. 2 shows, by way of example, the expected pattern of digital signals of test pixels $T_{n,0} \ldots T_{n+3,j-1}$ of FIG. 1, test pixels of one and the same column being interconnected with the same reference voltage, and test pixels in adjoining columns k and k+1 being differently interconnected precisely when (k+1) modulo 4=0, i.e., when the division of k+1 by 4 results in an integer.

Since the test pixels are situated at the edge of the regular pixels and separately interconnected, they may be used for testing the image sensor without impacting the operation of the regular pixels. In particular, testing may be carried out during the reception of regular digital image signals which are generated based on voltages which are output by the regular pixels and determined by the incident light.

For this purpose, averagings of the digital signal values across all or several of the test pixels which are interconnected with the reference voltage are carried out in one exemplary specific embodiment of the present invention. As an alternative or in addition, averagings of the digital signal values across all or several of the test pixels which are interconnected with ground are carried out.

For example, the digital signal values of all test pixels which are interconnected with the reference voltage are averaged. The determined average value is compared to an expected average value. The expected average value may be predetermined or may be determined as a function of an instantaneous operating mode of the image sensor. An operating temperature of the image sensor and/or an instantaneous value of the reference voltage may be included in the determination, for example. Further influencing variables which may be considered are fluctuations in an analog and/or a digital amplification in the signal processing unit.

Advantageously, moreover a tolerance interval, i.e., a greater and a lower limiting value, is determined around the expected average value, the tolerance interval also being either predetermined or being determined as a function of the instantaneous operating mode of the image sensor. The magnitude of the tolerance interval may increase as the operating temperature rises, for example.

By comparing the average value determined from the digital signal values to the tolerance interval, it is then possible to establish, for example, whether the image sensor is supplying digital signal values which are multiplicatively too bright or too dark by a factor different from 1. Moreover an image shift may be identified since the evaluated test pixels are then not those which are interconnected with the reference voltage.

Analogously, in addition or as an alternative, an averaging of the digital signal values of all test pixels which are interconnected with ground may be carried out. In this way, an image shift may also be identified since the evaluated test pixels are then not those which are interconnected with ground. Moreover, an additive offset of the signal values may be identified since the expected average value across all test pixels interconnected with ground is zero, again a tolerance interval being considerable here.

Analogously, in addition or as an alternative, an averaging of the digital signal values of all test pixels in the particular block may be carried out for one, multiple or all block(s). The determined average value of the particular block may then be compared to an expected average value. The expected average value may be predetermined or may be determined as a function of an instantaneous operating mode of the image sensor and/or of the average value across all accordingly identically interconnected test pixels. An operating temperature of the image sensor and/or an instantaneous value of the reference voltage may be included in the determination, for example. Further influencing variables which may be considered are fluctuations in an analog and/or a digital amplification in the signal processing unit.

Advantageously, moreover a tolerance interval, i.e., a greater and a lower limiting value, is determined around the expected average value, the tolerance interval also being either predetermined or being determined as a function of the instantaneous operating mode of the image sensor. The magnitude of the tolerance interval may increase as the operating temperature rises, for example.

Analogously, in addition or as an alternative, an averaging of the digital signal values of all identically interconnected test pixels in the particular row/column may be carried out for one, multiple or all row(s) and/or column(s). The average value of a row/column may then be compared to the average value of all accordingly identically interconnected test pixels. This makes it possible to detect a row error or a column error in the signal processing unit.

Finally, it is possible to compare the digital signal value of the particular test pixel to the average value across accordingly interconnected test pixels for one, multiple or all test pixel(s). For example, in this way a digital signal value of one test pixel may be compared to the corresponding average value across all test pixels, the average value across the block containing the test pixel, the corresponding average value across the column containing the test pixel and/or the corresponding average value across the row containing the test pixel.

In this way, it is possible to account for variations in the signal processing of individual rows or columns, for example.

Table 1 shows, by way of example, digital signal values of test pixels in 4 rows which are interconnected with the reference voltage in 4*4 test pixel sized blocks. The expected digital signal response for the test pixels from Table 1 is 100. Table 1 shows the actually received signal values:

TABLE 1

| | Block | | | | | | | | | | | | | |
|---|---|---|---|---|---|---|---|---|---|---|---|---|---|---|
| | 1 | | | | | 3 | | | | | 99 | | | |
| Row 1 | 100 | 99 | 105 | 95 | ... | 98 | 65 | 100 | 103 | ... | 101 | 100 | 99 | 102 |
| Row 2 | 101 | 98 | 103 | 94 | ... | 99 | 65 | 102 | 102 | ... | 100 | 102 | 97 | 101 |
| Row 3 | 102 | 97 | 104 | 97 | ... | 95 | 65 | 104 | 101 | ... | 101 | 201 | 99 | 103 |
| Row 4 | 99 | 99 | 105 | 94 | ... | 97 | 65 | 103 | 102 | ... | 102 | 100 | 98 | 102 |

Table 2 shows, by way of example, digital signal values of the test pixels which are interconnected with ground. The expected digital signal response for the test pixels from Table 2 is 0. Table 2 shows the actually received signal values:

TABLE 2

| | Block | | | | | | | | |
|---|---|---|---|---|---|---|---|---|---|
| | 2 | | | | | 100 | | | |
| Row 1 | 1 | 0 | 3 | 5 | ... | 0 | 2 | 5 | 3 |
| Row 2 | 2 | 1 | 3 | 4 | ... | 2 | 4 | 6 | 5 |
| Row 3 | 4 | 0 | 5 | 5 | ... | 1 | 1 | 7 | 3 |
| Row 4 | 1 | 2 | 3 | 5 | ... | 9 | 2 | 8 | 4 |

Using tolerance intervals which allow signal responses from 0 to 5 and from 95 to 105, the following conclusions may be drawn.

The average value across the signal values of all test pixels having the expected signal response 100 is in the tolerance interval around 100, so that no multiplicative shift is established.

The average value across the signal values of all test pixels having the expected signal response 0 is in the tolerance interval around 0, so that no additive shift is established.

The average value across the signal values of all test pixels in block 1 is in the tolerance interval around 100, so that no error is established in block 1.

The average value across the signal values of all test pixels in block 3 is outside the tolerance interval around 100, so that an error is established in block 3.

The average value across the signal values of all test pixels in block 99 is outside the tolerance interval around 100, so that an error is established in block 99.

The average value across the signal values of all test pixels in block 2 is in the tolerance interval around 0, so that no error is established in block 2.

The average value across the signal values of all test pixels in block 100 is in the tolerance interval around 0, so that no error is established in block 100.

The average value across the signal values of all test pixels in column 10 (second column of block 3) is outside the tolerance interval around 100, so that an error is established in the second column of block 3.

The average value across the signal values of all test pixels in column 394 (second column of block 99) is outside the tolerance interval around 100, so that an error is established in the second column of block 99.

The average value across the signal values of all test pixels having an expected signal value of 100 in the third row is outside the tolerance interval around 100, so that an error is established in the third row.

It is now possible to individually compare the signal values output by test pixels in the columns identified as faulty to the tolerance interval around the expected signal value. Moreover, it is possible to individually compare the signal values output by test pixels situated in the rows identified as faulty and at the same time in blocks identified as faulty to the tolerance interval around the expected signal value.

In this way, it is ultimately possible to establish that in total 5 test pixels do not function correctly. It may now be decided whether such an error rate is tolerable for the particular application or whether the image sensor must be considered defective. The method may be easily implemented on a computer using hardware components or software. It allows a robust, efficient analysis of an image sensor which does not intervene in the normal operation, including a portion of the signal processing path. It is thus used to support an efficient image processing architecture, for example in safety-critical applications.

What is claimed is:

1. A method for testing an image sensor having (i) regular pixels and test pixels, of which each is interconnected with one of two predefined voltage values, and (ii) a signal processing unit for providing digital signal values for output voltages of the pixels and test pixels, the method comprising:
receiving digital signal values of the test pixels; and
using the signal values of at least one subset of the test pixels for testing the image sensor, wherein all test pixels of the at least one subset are interconnected with a first of the two voltage values, and wherein:
the test pixels are arranged in rows and columns and interconnected in blocks;
test pixels within one block are identically interconnected;
test pixels within adjoining blocks are differently interconnected; and
the signal values of the at least one subset used to test the image sensor include one of: (i) all test pixels from one row interconnected with the first voltage value, (ii) all test pixels from one column interconnected with the first voltage value, (iii) all test pixels from one block interconnected with the first voltage value, or (iv) all test pixels from all blocks which are interconnected with the first voltage value.

2. The method as recited in claim 1, wherein the image sensor is tested for at least one of (i) a brightness error, (ii) a row processing error, (iii) a column processing error, (iv) a block position deviation, and (v) an image shift.

3. The method as recited in claim 1, wherein signal values of at least one additional subset of the test pixels are used to test the image sensor, the at least one additional subset of the test pixels including one of: (i) all test pixels from one row interconnected with a second voltage value, (ii) all test pixels from one column interconnected with the second voltage value, (iii) all test pixels from one block interconnected with the second voltage value, or (iv) all test pixels from all blocks which are interconnected with the second voltage value.

4. The method as recited in claim 1, wherein signal values of the at least one subset of the test pixels are used to test the image sensor, and wherein signal values of remaining subsets of the test pixels are used for image sensing.

5. The method as recited in claim 1, wherein a lower limiting value and an upper limiting value are determined by averaging across the signal values of test pixels of a reference subset.

6. The method as recited in claim 5, wherein the limiting values are determined by taking into consideration a temperature measurement.

7. The method as recited in claim 5, wherein a signal value of a selected test pixel from the subset is compared to the limiting values, the selected test pixel being identified as faulty when the signal value of the selected test pixel is one of lower than the lower limiting value or greater than the upper limiting value.

8. A device for testing an image sensor having (i) regular pixels and test pixels, of which each is interconnected with one of two predefined voltage values, and (ii) a signal processing unit for providing digital signal values for output voltages of the pixels and test pixels, the device comprising:
an electronic data processing device interface for receiving digital signal values of the test pixels; and
a control unit including a processor configured to use the signal values of at least one subset of the test pixels for testing the image sensor, wherein all test pixels of the at least one subset are interconnected with a first of the two voltage values, and wherein:
the test pixels are arranged in rows and columns and interconnected in blocks;
test pixels within one block are identically interconnected;
test pixels within adjoining blocks are differently interconnected; and
the signal values of the at least one subset used to test the image sensor include one of: (i) all test pixels from one row interconnected with the first voltage value, (ii) all test pixels from one column interconnected with the first voltage value, (iii) all test pixels from one block interconnected with the first voltage value, or (iv) all test pixels from all blocks which are interconnected with the first voltage value.

9. A vehicle image sensor system, comprising:
an image sensor having regular pixels and test pixels, of which each is interconnected with one of two predefined voltage values;
a signal processing unit for providing digital signal values for output voltages of the pixels and test pixels; and
a test device for testing the image sensor, wherein the test device is connected to the image sensor to receive the digital signal values of the test pixels of the subset, the test device is configured to use the signal values of at least one subset of the test pixels for testing the image sensor, and all test pixels of the at least one subset are interconnected with a first of the two voltage values, and wherein:
the test pixels are arranged in rows and columns and interconnected in blocks;
test pixels within one block are identically interconnected;
test pixels within adjoining blocks are differently interconnected; and
the signal values of the at least one subset used to test the image sensor include one of: (i) all test pixels from one row interconnected with the first voltage value, (ii) all test pixels from one column interconnected with the first voltage value, (iii) all test pixels from one block interconnected with the first voltage value, or (iv) all test pixels from all blocks which are interconnected with the first voltage value.

* * * * *